United States Patent
Pan et al.

(10) Patent No.: US 7,205,238 B2
(45) Date of Patent: *Apr. 17, 2007

(54) CHEMICAL MECHANICAL POLISH OF PCMO THIN FILMS FOR RRAM APPLICATIONS

(75) Inventors: Wei Pan, Vancouver, WA (US); David R. Evans, Beaverton, OR (US); Allen Burmaster, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 146 days.

This patent is subject to a terminal disclaimer.

(21) Appl. No.: 10/971,665

(22) Filed: Oct. 21, 2004

(65) Prior Publication Data

US 2006/0099813 A1 May 11, 2006

(51) Int. Cl.
- H01L 21/8238 (2006.01)
- H01L 21/8242 (2006.01)
- H01L 21/302 (2006.01)
- H01L 21/461 (2006.01)

(52) U.S. Cl. .................. 438/691; 438/199; 438/240

(58) Field of Classification Search ............... 438/691, 438/3–240, 199, 202
See application file for complete search history.

(56) References Cited

U.S. PATENT DOCUMENTS

| | | | |
|---|---|---|---|
| 6,204,139 B1 * | 3/2001 | Liu et al. | 438/385 |
| 6,723,643 B1 * | 4/2004 | Pan et al. | 438/689 |
| 6,759,249 B2 | 7/2004 | Zhuang et al. | |
| 7,030,498 B2 * | 4/2006 | Kakamu et al. | 257/774 |

OTHER PUBLICATIONS

Liu et al., *Electric-pulse-induced reversible resistance change effect in magnetoresistive films*, Applied Physics Letters, vol. 76, No. 19; May 8, 2000, pp. 2749-2751.

* cited by examiner

Primary Examiner—Chuong Anh Luu
(74) Attorney, Agent, or Firm—Robert D. Varitz, PC

(57) ABSTRACT

A method of fabricating a CMR layer in a CMOS device using CMP to pattern the CMR layer includes preparing a silicon substrate, including fabrication of a bottom electrode in the silicon substrate; depositing a layer of $SiN_x$ on the substrate; patterning and etching the $SiN_x$ layer to form a damascene trench over the bottom electrode; depositing a layer CMR material over the $SiN_x$ and in the damascene trench; removing the CMR material overlying the $SiN_x$ layer by CMP, leaving the CMR material in the damascene trench; and completing the CMOS structure.

5 Claims, 3 Drawing Sheets

CHEMICAL MECHANICAL POLISH OF PCMO THIN FILMS FOR RRAM APPLICATIONS

FIELD OF THE INVENTION

The present invention relates to the non-volatile resistance RAM (RRAM) structures and CMOS process to fabricate such memory devices, and to chemically mechanically polish (CMP) of $Pr_{1-x}Ca_xMnO_3$ (PCMO) thin films in integrated circuits generally.

BACKGROUND OF THE INVENTION

Colossal magnetoresistance (CMR) materials, such as PCMO, have been found to have varying resistance states upon application of electric pulses. The use of this type of CMR material in non-volatile resistance random access memory (RRAM) applications has many advantages. However, commercially viable integration of a CMR film into a CMOS IC has not been successfully accomplished.

The reversible resistance switch properties of PCMO metal oxide thin films by applying nanoseconds short electric pulses has been disclosed by Liu et al., *Electric-pulse-induced Reversible Resistance Change Effect in Magnetoresistive Films*, Applied Physics Letters, Vol. 76, No. 19, pp 2749–2751 (2000) and U.S. Pat. No. 6,204,139 B1, to Liu et al., granted Mar. 20, 2001, for Method for Switching the Properties of Perovskite Materials Used in Thin Film Resistors. Further work in this field is disclosed in U.S. Pat. No. 6,759,249, for Device and method for reversible resistance change induced by electric pulses in non-crystalline perovskite unipolar programmable memory, granted to Zhuang et al. on Jul. 6, 2004.

SUMMARY OF THE INVENTION

A method of fabricating a CMR layer in a CMOS device using CMP to pattern the CMR layer includes preparing a silicon substrate, including fabrication of a bottom electrode in the silicon substrate; depositing a layer of $SiN_x$ on the substrate; patterning and etching the $SiN_x$ layer to form a damascene trench over the bottom electrode; depositing a layer CMR material over the $SiN_x$ and in the damascene trench; removing the CMR material overlying the $SiN_x$ layer by CMP, leaving the CMR material in the damascene trench; and completing the CMOS structure.

It is an object of the invention to provide a CMR layer in a CMOS IC.

Another object of the invention is to provide such a CMR layer in a commercially feasible method.

A further object of the invention is to fabricate a CMR layer in a CMOS IC which fabrication process includes CMP of the CMR layer.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

In the method of the invention, a damascene structure is constructed and chemical mechanical polishing (CMP) thereof is described as a commercially viable approach for patterning a colossal magnetoresistance (CMR) film, such as $Pr_{1-x}Ca_xMnO_3$ (PCMO), in a CMOS circuit. Several commercially available CMP slurries have been used to polish PCMO thin films, such as ILD1300 and STS1000B/STS1000A (5:1 mixture). In the preferred embodiment of the method of the invention, a silica plus $NH_4OH$ slurry, i.e., ILD1300, commonly used for polishing $SiO_2$, diluted, 1:1 with distilled water is used to polish a CMR film.

The CMP rate of PCMO films, either deposited by spin-coating or sputtering, is high enough to meet the process requirement, although it is slower than the CMP rate of tetraethylorthosilicate oxide (oxane) (TEOS), especially when the PCMO film is deposited by sputtering. Because of the faster CMP rate of oxides, the CMP selectivity between CMR materials and $SiO_2$ films is poor. That means that CMP of CMR films will not stop at an underlying TEOS film, resulting in an over-polishing of the CMR film, which renders CMR thickness control difficult. $SiO_2$ films cannot be used as an underlying material for PCMO growth when the PCMO is to be chemically mechanically polished. $SiN_x$ films, however, have a CMP rate which is only about one-third that of the CMP rate of PCMO, which is much lower than the CMP rate of $SiO_2$.

Figure 1:
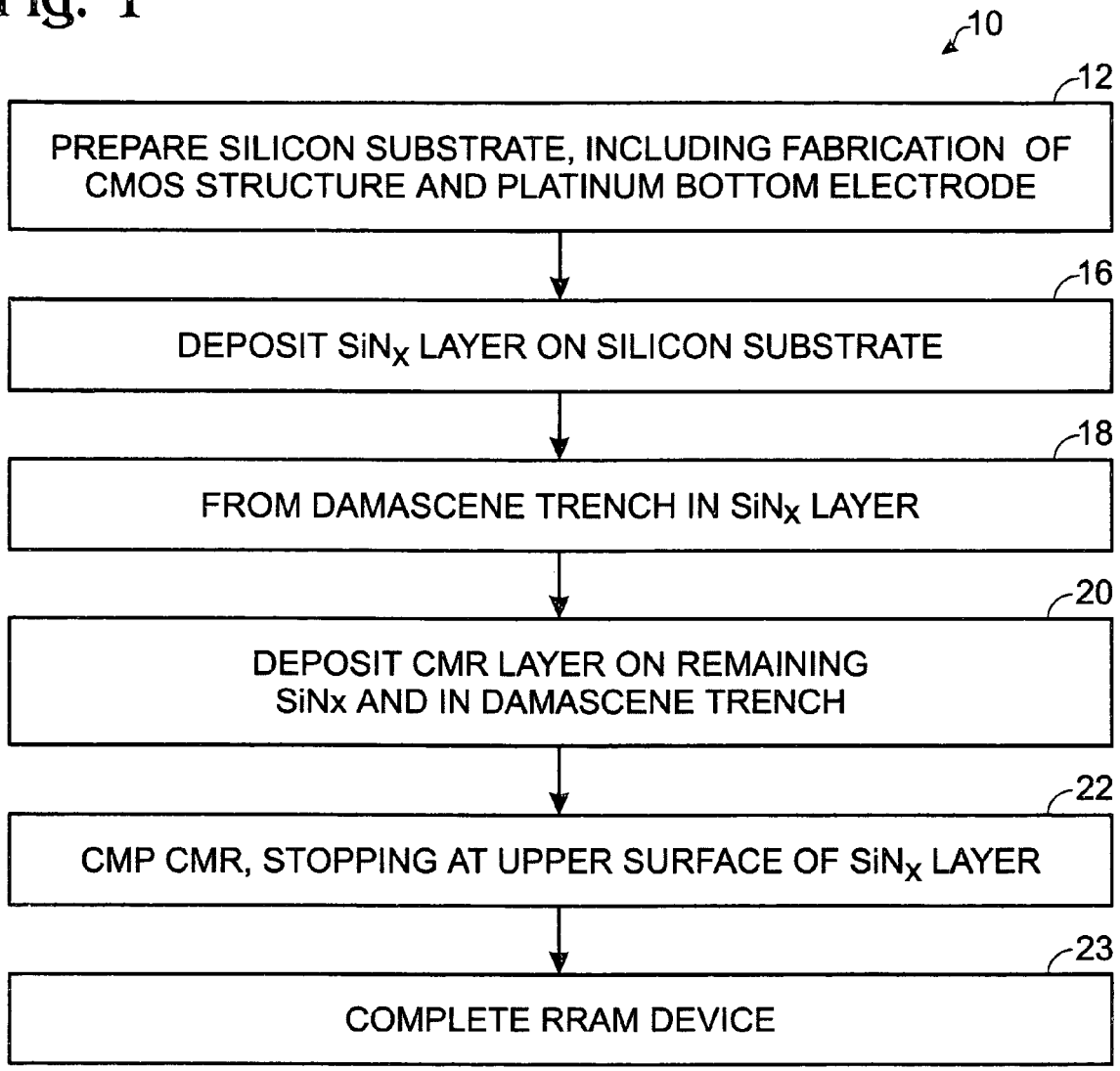
FIG. 1 is a block diagram depicting steps in the method of the invention.
Figure 2:
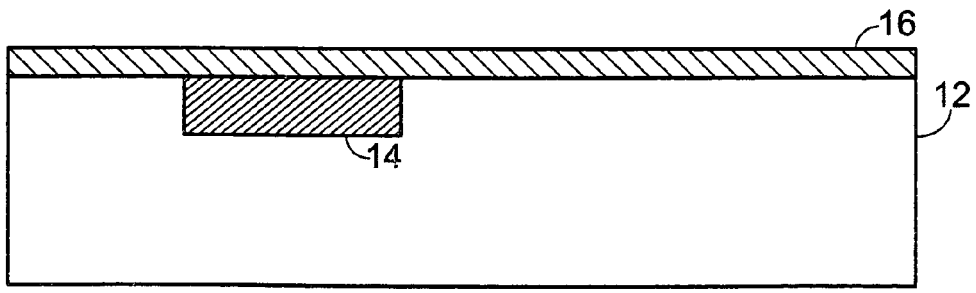
FIGS. 2–5 depict steps in the method of the invention.

Referring initially to FIGS. 1 and 2–5, the method of the invention is described, which method is depicted generally at 10 in FIG. 1. The initial steps in the method of the invention require fabrication of a damascene trench, which will ultimately contain a PCMO structure. FIG. 2 depicts the fabrication after preparation of a silicon substrate, 12. In this instance, substrate preparation includes fabrication of a well structure in the substrate, isolation, gate stacks and provision of a bottom electrode, 14. Other CMOS structures may also be formed on the substrate prior to the application of the method of the invention. A layer of $SiN_x$ 16 is deposited over the substrate and the bottom electrode.

Figure 3:
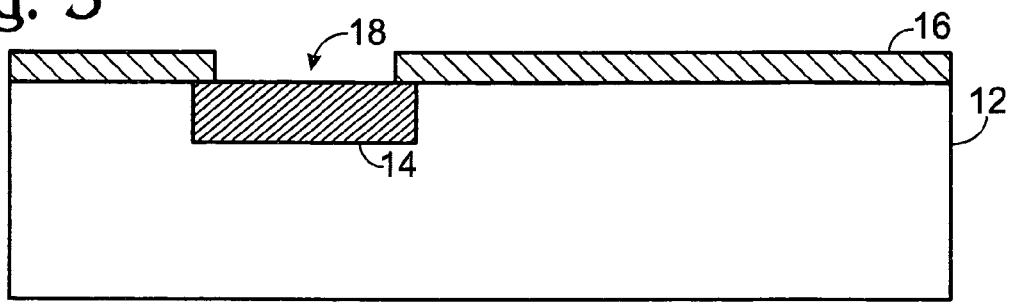

As shown in FIG. 3, $SiN_x$ layer 16 is patterned and etched, resulting in the formation of a damascene trench 18. The depth of trench 18 is selected to be equal to that of the desired thickness of the CMR layer which will be formed in the trench, which is typically PCMO and is typically between about 50 nm and 200 nm.

Figure 4:
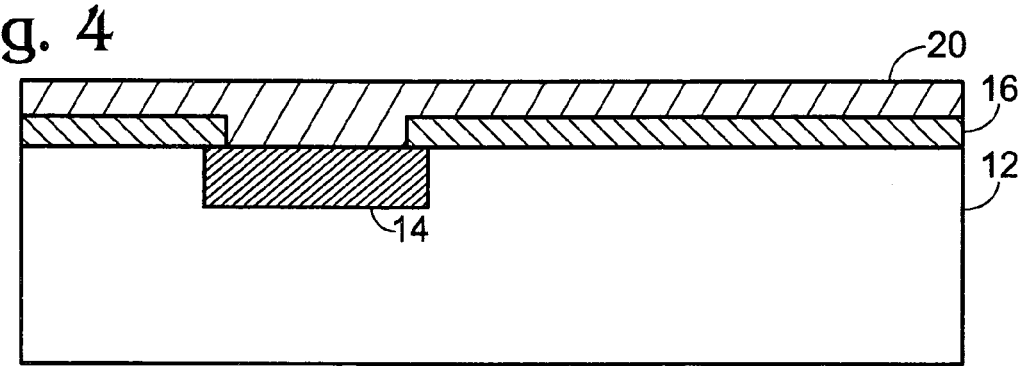

FIG. 4 depicts the structure after deposition of the CMR thin film 20, which may be deposited either by spin-coating or sputtering.

Figure 5:
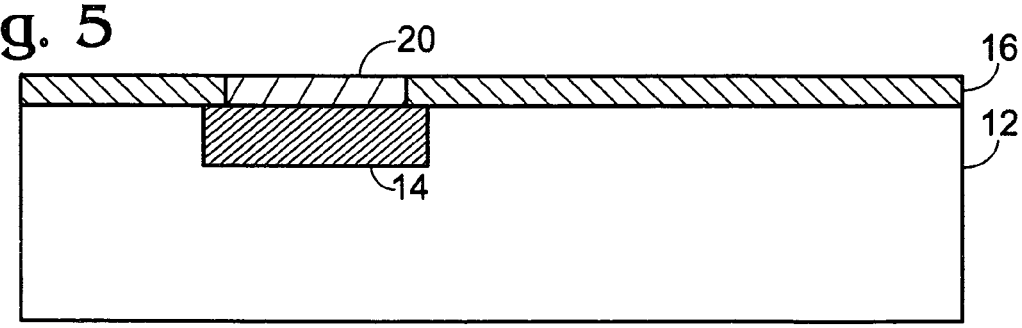

FIG. 5 depicts the final result of the method of the invention, wherein the CMR layer is chemically mechanically polished 22 to remove the CMR layer over the field and to leave the CMR material in trench 18. The RRAM device is then completed according to state-of-the-art techniques, 23.

Figure 6:
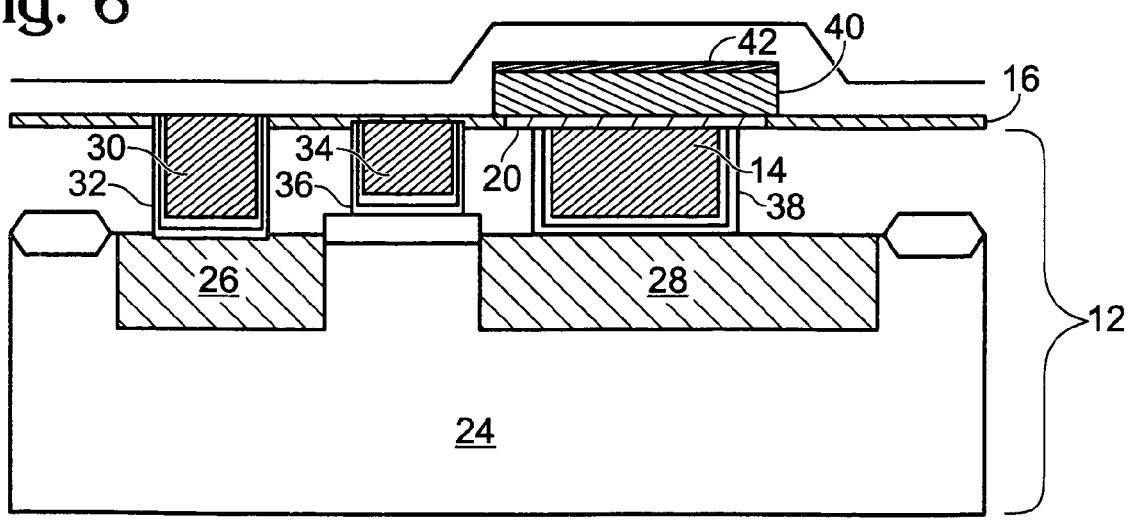
FIG. 6 depicts a RRAM device constructed according to the method of the invention.

FIG. 6 depicts a nearly-final CMOS structure fabricated using the method of the invention, wherein a P-well 24 is formed in substrate 12, N+ regions 26, 28 are formed in source and drain active regions; respectively, a source bottom electrode 30, likely of platinum, is formed in a barrier structure 30 while a gate bottom electrode 34, again, likely of platinum, is formed in a barrier structure 36, and a barrier structure 38 is formed about drain bottom electrode 14. In all instances, the barrier structure is fabricated of one or more layers of titanium and TiN. A platinum top electrode 40 is formed over the CMR layer 20, and a titanium cap 42 fabricated over top electrode 40.

Figure 7:
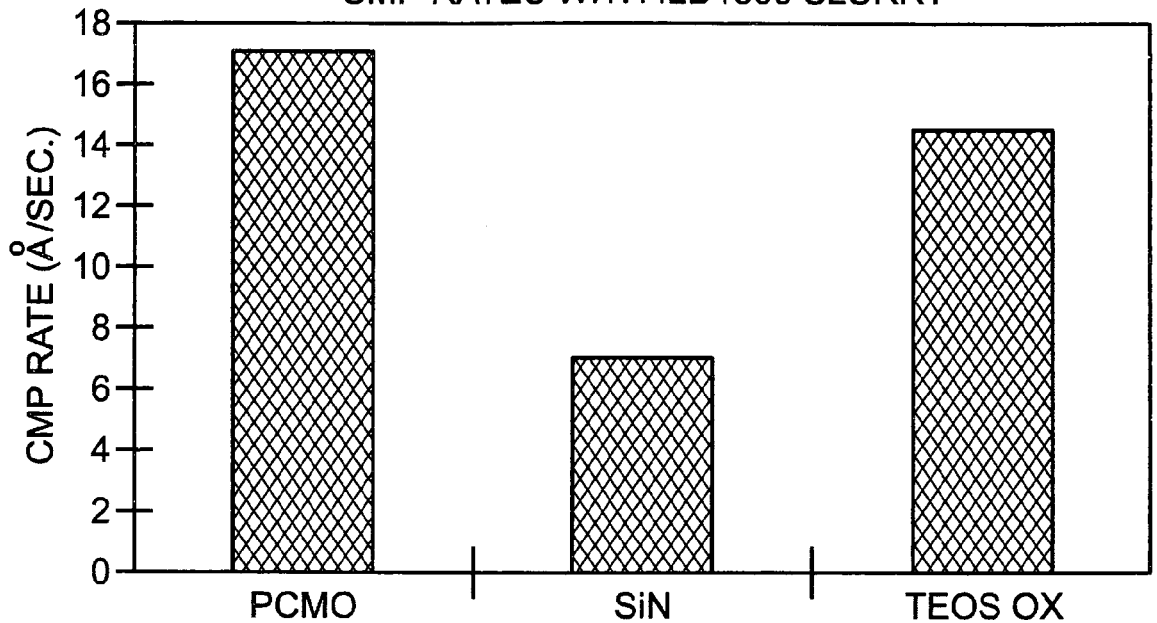
FIG. 7 depicts CMP rates of various materials using a ILD 1300 slurry.
Figure 8:
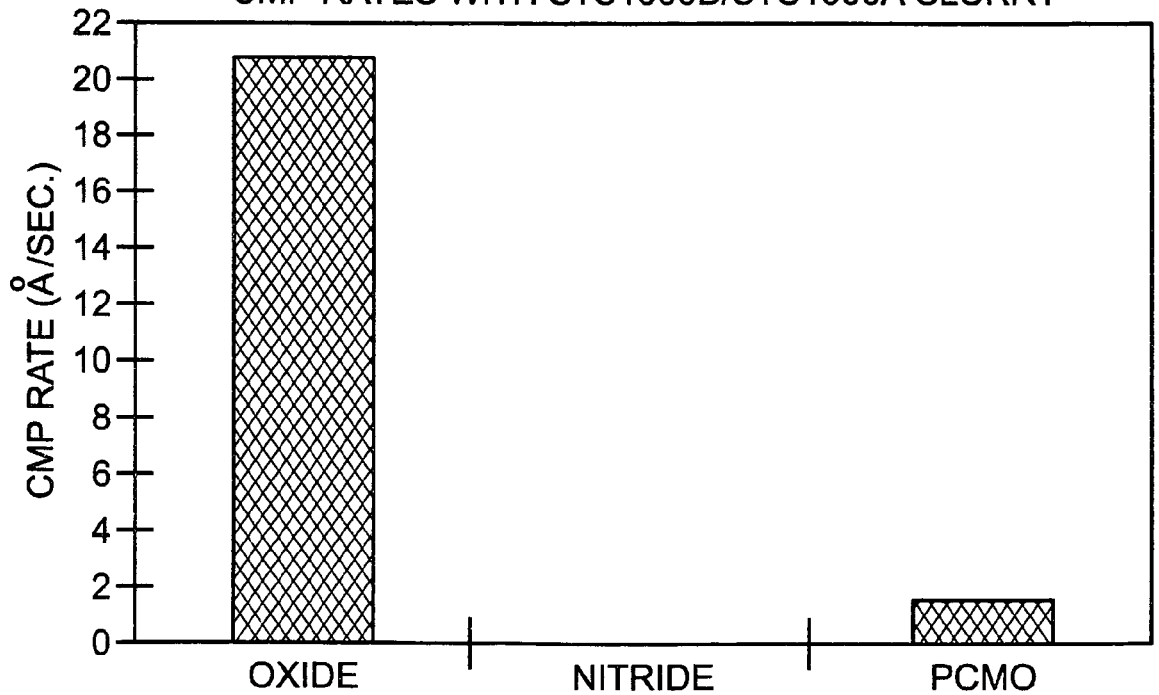
FIG. 8 depicts CMP rates of various materials using a STS 1000B/STS1000A slurry.

FIG. 7 depicts the CMP rate chart of various materials using ILD1300 slurry. FIG. 8 depicts the CMP rate of various materials using STS1000B/A slurry, which shows a low CMP rate on PCMO and on $SiN_x$.

The method of the invention is the only known commercially viable method for patterning CMP materials other than a much more complex dry etch process. It provides a viable method for fabrication of PCMO RRAM devices.

Thus, a commercially viable method for fabrication of CMR layer in a CMOS structure has been disclosed. It will be appreciated that further variations and modifications thereof may be made within the scope of the invention as defined in the appended claims.

We claim:

1. A method of fabricating a CMR layer in a CMOS device using CMP to pattern the CMR layer, comprising:
   preparing a silicon substrate, including fabrication of a bottom electrode in the silicon substrate;
   depositing a layer of $SiN_x$ on the substrate;
   patterning and etching the $SiN_x$ layer to form a damascene trench over the bottom electrode;
   depositing a layer CMR material over the $SiN_x$ and in the damascene trench;
   removing the CMR material overlying the $SiN_x$ layer by CMP, leaving the CMR material in the damascene trench; and
   completing the CMOS structure.

2. The method of claim 1 wherein the CMR material is $Pr_{1-x}Ca_xMnO_3$.

3. The method of claim 1 wherein said removing the CMR material overlying the $SiN_x$ layer by CMP includes providing a silica plus $NH_4OH$ slurry diluted 1:1 with distilled water.

4. A method of fabricating a $Pr_{1-x}Ca_xMnO_3$ layer in a CMOS device using CMP to pattern the $Pr_{1-x}Ca_xMnO_3$ layer, comprising:
   preparing a silicon substrate, including fabrication of a bottom electrode in the silicon substrate;
   depositing a layer of $SiN_x$ on the substrate;
   patterning and etching the $SiN_x$ layer to form a damascene trench over the bottom electrode;
   depositing a layer $Pr_{1-x}Ca_xMnO_3$ over the $SiN_x$ and in the damascene trench;
   removing the $Pr_{1-x}Ca_xMnO_3$ overlying the $SiN_x$ layer by CMP, leaving the $Pr_{1-x}Ca_xMnO_3$ in the damascene trench; and
   completing the CMOS structure.

5. The method of claim 4 wherein said removing the CMR material overlying the $SiN_x$ layer by CMP includes providing a silica plus $NH_4OH$ slurry diluted 1:1 with distilled water.

* * * * *